United States Patent
Birnstock et al.

(10) Patent No.: US 7,287,469 B2
(45) Date of Patent: Oct. 30, 2007

(54) DEVICE AND METHOD FOR CONTINUOUS SCREEN PRINTING OF ORGANIC LIGHT EMITTING DIODES

(75) Inventors: Jan Birnstock, Dresden (DE); Joerg Blaessing, Oberkochen (DE); Karsten Heuser, Erlangen (DE); Georg Wittmann, Herzogenaurach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 43 days.

(21) Appl. No.: 10/483,876

(22) PCT Filed: Jul. 9, 2002

(86) PCT No.: PCT/DE02/02513

§ 371 (c)(1),
(2), (4) Date: Jan. 13, 2004

(87) PCT Pub. No.: WO03/006242

PCT Pub. Date: Jan. 23, 2003

(65) Prior Publication Data

US 2004/0216625 A1    Nov. 4, 2004

(30) Foreign Application Priority Data

Jul. 13, 2001    (DE) .................. 101 34 132

(51) Int. Cl.
*B41F 15/08*    (2006.01)

(52) U.S. Cl. .............. 101/129; 101/114; 313/512; 445/25

(58) Field of Classification Search .......... 101/114, 101/115, 116, 117, 118, 119, 120, 121, 122, 101/123, 126, 129, 35, 483; 428/195.1, 917; 313/504, 512; 445/25, 24
See application file for complete search history.

(56) References Cited

U.S. PATENT DOCUMENTS

| | | | | | |
|---|---|---|---|---|---|
| 2,019,375 | A | * | 10/1935 | Wheelwright | 101/115 |
| 2,710,577 | A | * | 6/1955 | Prett | 101/124 |
| 3,168,036 | A | * | 2/1965 | Elsasser | 101/129 |
| 3,229,627 | A | * | 1/1966 | Pollitt | 101/115 |
| 3,672,934 | A | * | 6/1972 | Larry | 427/210 |
| 4,079,674 | A | * | 3/1978 | Ichinose | 101/129 |
| 4,919,043 | A | * | 4/1990 | Bubley et al. | 101/123 |

(Continued)

FOREIGN PATENT DOCUMENTS

DE    82677    3/1894

(Continued)

OTHER PUBLICATIONS

Birnstock et al., "Screen-printed passive matrix displays based on light-emitting polymers", Applied Physics Letters, 2001, vol. 78, No. 24, pp. 13905-13907.

(Continued)

*Primary Examiner*—Leslie J. Evanisko
(74) *Attorney, Agent, or Firm*—Fish & Richardson P.C.

(57) ABSTRACT

Devices and method for continuous printing of organic light-emitting diodes (OLEDs) are described. A substrate with or without coating is provided as strip material on a roll, and is fed through a device with movable screens for imprinting by screen printing.

16 Claims, 1 Drawing Sheet

U.S. PATENT DOCUMENTS

| | | | | |
|---|---|---|---|---|
| 4,998,470 A | * | 3/1991 | Klemm | 101/115 |
| 5,165,336 A | * | 11/1992 | Spencer | 101/35 |
| 6,867,539 B1 | * | 3/2005 | McCormick et al. | 313/504 |

FOREIGN PATENT DOCUMENTS

| | | |
|---|---|---|
| DE | 1220443 | 11/1963 |
| DE | 2607929 | 2/1976 |
| DE | 19918193 A1 | 4/1999 |
| EP | 0724 956 A1 | 8/1996 |
| WO | WO99/07189 | 2/1999 |
| WO | WO 99/49525 | 9/1999 |

OTHER PUBLICATIONS

Mori, K. et al., "Organic Light-Emitting Devices Patterned by Screen-Printing", Japan J. Applied Physics, 2000, vol. 39, pp. 942-944.

Pardo, D.A. et al., "Application of Screen Printing in the Fabrication of Organic Light-Emitting Devices", Advanced Materials, Sep. 1, 2000, 12, No. 17, pp. 1249-1252.

Rogers, J.A., et al., "Printing process suitable for reel-to-reel production of high-performance organic transistors and circuits", Advanced Materials, Jul. 5, 1999, 11, No. 9, pp. 741-745.

Kammann "Roll to roll screen printing", K61-35.

* cited by examiner

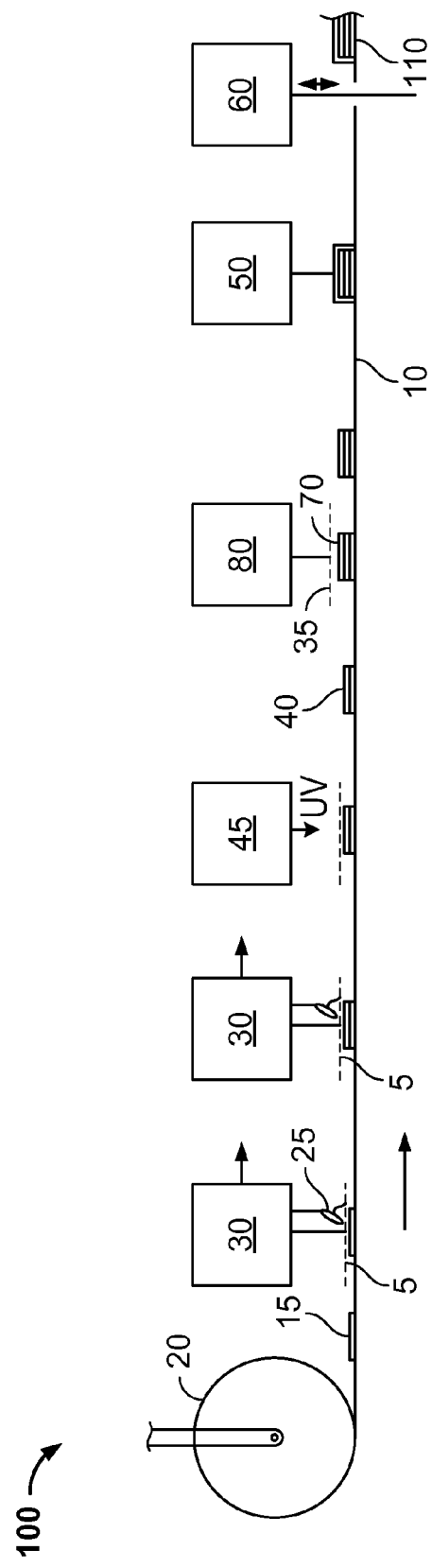
Figure

DEVICE AND METHOD FOR CONTINUOUS SCREEN PRINTING OF ORGANIC LIGHT EMITTING DIODES

BACKGROUND

The invention relates to a device and method for continuous printing of organic light-emitting diodes (OLEDs).

Organic light-emitting diodes (OLEDs), based on organic material such as polymers and/or "small molecules" as the principal material of the functional layers, have developed very rapidly in recent years. Improved efficiency, a large number of new colors, and lower usage voltages make them of interest for many areas of application. Typical applications can be low-information-content passive-matrix displays with a few thousand pixels and an icon bar, backlights for LCDs, or planar illumination elements. The advantages of OLEDs, such as Lambert's reradiation and minimal thickness, are useful for these applications.

At present, the functional layers of which an OLED consists (e.g., poly(1,4-phenylene vinylene), PPV or polyfluorene, and/or derivatives of these materials) are usually applied to the glass or film substrate and/or to a bottom and/or structured layer using the spin-on application method. This method has a number of drawbacks: the bulk of the polymer solution (about 98%) is irretrievably lost, the spin-on application process is relatively lengthy (about 30-60 seconds) and, in the case of larger substrates, it is almost impossible to apply homogeneous functional layers.

For these reasons, alternative methods of applying organic material onto large surfaces are being sought. A number of printing processes are suitable for this purpose: screen printing, pad printing, inkjet printing, letterpress and rotogravure methods [e.g., D. A. Pardo, G. E. Jabbour, and N. Peyghambrian, "*Application of Screen Printing in the Fabrication of Organic Light-Emitting Devices*"; Adv. Mat., 2000, 17, p. 1249-1252; K. Mori et al., "*Organic Light-Emitting Devices Patterned by Screen-Printing*"; Jpn. J. Appl. Phys., 2000, 39, p. 942-944; Birnstock et al., "*Screen-printed passive matrix displays based on light-emitting polymers*"; Appl. Phys. Lett., Vol. 78, No. 24, 2001]. These printing methods are also advantageous because they permit the organic material to be applied after it has already been structured, making multichrome or full-color OLEDs possible.

Where a majority of the processes have thus far been developed for glass substrates, flexible substrates (e.g., films) will become increasingly important in the future.

BRIEF DESCRIPTION OF THE DRAWING

The FIGURE shows a schematic of a continuous screen printing system.

The goal of the invention is to provide a device and method for the continuous application of soluble organic material, especially polymers, to substrate, especially flexible substrates, which operate continuously.

For economic reasons, the substrates should no longer be printed using a "stop-and-go" method, as is the case with classic printing on glass substrate, but instead should be coated in a continuous process using strip material, such as material "on a roll." In this process, the film substrate 10, which maybe pre-structured, is supplied on a roll 20 and is imprinted with one or more polymers as the film 10 is unwound from the roll 20 in a uniform motion.

The invention solves the problem in that a special screen printing method is used to print the OLEDs.

The subject matter of the invention is a device 100 for the continuous imprinting of a substrate-strip material 10 by means of screen printing, comprising at least one printing screen 5 and in which the substrate strip material 10 is supplied on a roll 20, wherein a device 30 for moving the printing screen 5 is provided which ensures that it can accompany the strip material 10 during printing and, following printing, be returned to its original position.

Another subject matter of the invention is a method for imprinting a substrate strip material 10 by means of screen printing, in which the substrate is moved past at least one screen 5, wherein the screen 5 accompanies the strip material 10 during printing.

Finally, a subject matter of the invention is a product such as an OLED, which comprises at least one functional layer 40 that was applied in a continuous process by means of screen printing.

DETAILED DESCRIPTION

The term substrate strip material preferably describes flexible substrates such as films, etc., which exist in strip form. The substrate serves as the carrier of an OLED.

According to an advantageous embodiment, the device comprises a row of identically acting screens that are arranged in series and accompany successive areas of the strip material during printing. In particular, the row of screens consisting of an organic material and/or a screen stencil is arranged in such a way that there are no non-printed and therefore unusable areas on the strip material. Thus, virtually 100% of the strip is utilized and a section of the completely coated strip produces two edges of two substrates.

According to an embodiment, the device prints at a level of precision that typically permits a tolerance of only a few dozen μm.

According to an embodiment of the method, the substrate strip material is imprinted at a typical speed of 0.5 m/s, preferably in the range of 0.25 to 1 m/s.

Strip widths are preferably between 50 and 500 mm, depending on the application.

According to an advantageous embodiment of the device, several differently operating screens or rows of screens are arranged in series, so that a complete OLED can be produced in one device.

A substrate strip material is typically 0.005 to 1 mm thick and 50 to 500 mm wide.

It can also be advantageous that a certain distance between one imprinted area and the next on the substrate strip material is desired, so that a device without rows of screens, which has only one screen for each printing sub-step, is certainly preferable to a device with rows of screens, i.e., several identically operating screens for each printing sub-step. It can also be provided that, in a device with several screens, a row of screens can be used variably or parked, meaning that they are used or not used, depending on requirements. In addition to the screens with the template, a wiper blade 25 and a tank for the solution of organic material, the device can also comprise a device for irradiating 45 UV-curable functional layers, a heating system, a blower, a distributor and/or another apparatus for producing an OLED.

In one embodiment, a chatting 60 and/or stamping device 50 for separating and/or encapsulating the individual OLEDs 110 is provided at the output of the device, where the fully printed strip material exits the device.

Other elements, such as the device for unwinding the substrate-strip material as well as for maintaining the necessary strip tension area also comprised by the device and are part of the state of the art, which is the reason they are not described in great detail.

The imprinting of a uniformly moving film is not trivial, because the classic "roll-on-roll" processes (offset printing, etc.) cannot be used. This is because the photosensitive resist structures already located on the film are critical in this regard. As a result of these contact methods, they are either destroyed or transfer of the polymer solution is prevented. The conventional "stop and go" procedure unnecessarily stresses the substrate film during printing, which is not the case with the continuous method.

Another advantage of the process is the high speed and great precision with which the OLEDs can be produced.

In the following, the invention is described in greater detail on the basis of an exemplary embodiment:

The production of a flexible, monochromatic display based on organic light-emitting diodes using the special "screen-on-roll" screen printing method:

A transparent film 10 impermeable to water and oxygen is structured with ITO 15 (indium tin oxide) and provided with photoresist structures. (The purpose of the photosensitive resist structures is to separate the individual cathode strips and confine the printed polymer surfaces. These processes are known and well-understood.) As a result of the pre-structuring of the film, hundreds of individual passive-matrix displays are defined. The film is provided wrapped on a roll 20. Using the special screen printing machine 100, several conjugated polymers are consecutively printed onto the film and dried using suitable means. In this printing process, the film can be moved through the machine in a uniform motion. Finally, a cathode 70 is vapor deposited using a vapor deposition device 80 in a structured manner (e.g., through shadow masks 35) and the active side of the film is also sealed to be watertight and airtight. Now the individual displays can be cut out using a cutting device 60 and contacted.

The invention relates to a device and method for continuous printing of organic light-emitting diodes 110 (OLEDs). In this connection, a substrate with or without coating is provided as strip material 10 on a roll 20, and is fed through a device with movable screens for imprinting by means of screen printing.

The invention claimed is:

1. A device for continuous imprinting of a substrate strip material that is supplied on a roll to form organic light emitting devices on the substrate strip material, comprising:
   a first printing screen;
   a printing screen moving device to cause the first printing screen to move with the substrate strip material from a first position, the first printing screen configured to accompany the substrate strip material as the substrate strip material is unwound from the roll, and to return to the first position, the device configured to form UV-curable organic functional layers on the substrate strip;
   a UV irradiating device for irradiating the UV-curable organic functional layers; and
   an encapsulation device for encapsulating individual organic light emitting diodes that are formed on the substrate strip material.

2. The device of claim 1, further comprising:
   a row of printing screens including the first printing screen.

3. The device of claim 2, wherein:
   the printing screens in the row of printing screens operate identically.

4. the device of claim 2, wherein:
   at least two printing screens in the row of printing screens operate differently from each other.

5. The device of claim 1, wherein:
   the first printing screen includes an organic material.

6. The device of claim 1, further comprising:
   a second printing screen positioned in series with the first printing screen.

7. The device of claim 1, further comprising at least one of a heating system, a blower or a distributor.

8. The device of claim 1, further comprising:
   a cutting device for separating the substrate strip material into individual organic light emitting diodes.

9. The device of claim 1, wherein:
   the printing screen moving device moves the printing screen at a speed of about 0.25 m/s to about 1 m/s.

10. The device of claim 1, wherein:
    the printing screen moving device moves the printing screen at a speed of about 0.5 m/s.

11. The device of claim 1, further comprising:
    a wiper blade for forcing organic material through the first printing screen; and
    a tank for providing a solution of the organic material.

12. A method for continuous imprinting of a substrate strip material that is supplied on a roll to form organic light emitting devices on the substrate strip material, comprising:
    moving the substrate strip material from a roll through a device having a printing screen;
    moving the printing screen with the substrate strip material;
    printing onto the substrate strip material using the printing screen as the screen moves with the substrate strip material and as the substrate strip material is unwound from the roll, forming UV-curable organic functional layers on the substrate strip;
    curing the UV-curable organic functional layers with UV light; and
    encapsulating individual organic light emitting diodes formed on the substrate strip material.

13. The method of claim 12, wherein:
    moving the printing screen includes moving the screen between a speed of about 0.25 m/s to about 1 m/s.

14. The method of claim 12, wherein:
    moving the printing screen includes moving the screen at a speed of about 0.5 m/s.

15. The method of claim 12, further comprising:
    cutting a printed substrate strip material to separate individual organic light emitting diodes.

16. A method for continuous imprinting of a substrate strip material that is supplied on a roll to form organic light emitting devices on the substrate strip material, comprising:
    unwinding a substrate from a roll through a device having a plurality of printing screens;
    printing a conjugated polymer onto the substrate using the plurality of printing screens as the substrate moves through the device to form a printed substrate strip;
    moving the printing screens with the substrate;
    depositing a cathode onto the printed substrate strip;
    encapsulating the printed substrate strip to encapsulate individual organic light emitting diodes; and
    cutting the printed substrate strip to separate the individual organic light emitting diodes.

* * * * *